United States Patent
Akatsuka et al.

(10) Patent No.: US 6,723,801 B2
(45) Date of Patent: Apr. 20, 2004

(54) POLYPHENOL RESIN, PROCESS FOR ITS PRODUCTION, EPOXY RESIN COMPOSITION AND ITS USE

(75) Inventors: Yasumasa Akatsuka, Saitama (JP); Toyofumi Asano, Saitama (JP); Masahiro Imaizumi, Tokyo (JP); Katsuhiko Oshimi, Saitama (JP); Syouichi Tomida, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/148,701

(22) PCT Filed: Oct. 3, 2001

(86) PCT No.: PCT/JP01/08693
§ 371 (c)(1), (2), (4) Date: May 31, 2002

(87) PCT Pub. No.: WO02/28940
PCT Pub. Date: Apr. 11, 2002

(65) Prior Publication Data
US 2003/0009001 A1 Jan. 9, 2003

(30) Foreign Application Priority Data
Oct. 5, 2000 (JP) .......................................... 2000-305854
Dec. 12, 2000 (JP) .......................................... 2000-377920

(51) Int. Cl.$^7$ ................................................ C08G 8/36
(52) U.S. Cl. ...................... 525/491; 525/492; 528/143; 528/153; 528/165; 568/719; 568/720; 568/732
(58) Field of Search ................................. 525/491, 492, 525/481; 528/143, 153, 165, 93, 98, 137; 568/719, 720, 732; 428/413, 418

(56) References Cited

U.S. PATENT DOCUMENTS 5,612,442 A * 3/1997 Okazaki ..................... 528/212
6,392,003 B1 * 5/2002 Kiuchi ....................... 528/163

FOREIGN PATENT DOCUMENTS

JP 10-251362 9/1998

* cited by examiner

Primary Examiner—Philip Tucker
Assistant Examiner—D. E. Aylward
(74) Attorney, Agent, or Firm—Nields & Lemack

(57) ABSTRACT

An object of the present invention is to provide an epoxy resin composition which has high flexibility, can be molded to a thin membrane, and can become a noninflammable cured product.

The present invention comprises a polyphenol compound obtained by reacting to condense phenol with bischloromethyl biphenyl or bismethoxymethyl biphenyl, removing unreacted phenol and then reacting with BCMB again, wherein the polyphenol compound has a weight-average molecular weight of 3,000 or more as determined by GPC, and using the polyphenol compound as an agent for curing an epoxy resin.

1 Claim, No Drawings

POLYPHENOL RESIN, PROCESS FOR ITS PRODUCTION, EPOXY RESIN COMPOSITION AND ITS USE

TECHNICAL FIELD

The present invention relates to a polyphenol resin which can provide an excellently noninflammable cured product and has flexibility enough to form a film; an epoxy resin; and the cured product, though it does not contain a halogenide flame-retardant or an antimony compound.

BACKGROUND ART

An epoxy resin can be cured by various curing agents to provide a cured product and it is generally excellent in mechanical properties, water proofing, chemicals resistance, heat resistance and electric properties. Therefore it has been widely utilized in the fields of adhesive, paint, laminate, molding material and casting material for example. The most popular epoxy resin which has been used includes a bisphenol A type epoxy resin. Other, tetrabromobisphenol A and the epoxylated product thereof, or the compound produced by reacting a bisphenol A type epoxy resin with tetrabromobisphenol A are generally known as a flame-retardant. As a curing agent for an epoxy resin, an acid anhydride or an amine compound is known, but a phenol novolac has been more often used in the field of electric and electronic parts because of the high reliability.

However, the above bromine-containing compound, if burned to waste, is liable to generate a substance to cause environmental pollution, though it is excellent in non-inflammability. An antimony compound used for the non-inflammable auxiliary agent also is concerned to have the toxicity.

Under this circumstance, recent increasing of consideration to environmental conservation demands to develop a halogen-free and antimony-free epoxy resin composition. On the other hand, an epoxy resin cured by a phenol novolac gives a cured product which is too tough and lacking in flexibility though it has excellent creditability. The recently developed electric/electronic parts do not take the conventional shape of a large package or a substrate made of glass fiber as the base material, but takes a molded shape of sheet obtained by coating a rasin in the form of varnish on a polyimide or PET(polyethylene glycol terephthalate) film or on a metallic foil and then removing the solvent. Therefore, it needs to use the resin having sufficient flexibility.

DISCLOSURE OF THE INVENTION

In view of these circumstances, the present inventors have studied diligently to find out an epoxy resin composition that can provide an excellently non-inflammable cured product and can be molded to a shape of sheet without losing the flexibility. As the result, the present invention has been completed.

Namely the present invention is as follows:

(1) A polyphenol resin represented by formula (1):

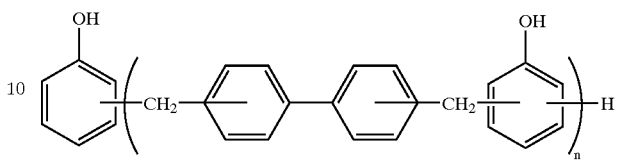

wherein, n is an average degree of polymerization as specified by the average molecular weight, and having a weight-average molecular weight of 3,000 or more as determined by gel permeation chromatography (GPC, hereinafter same).

(2) A method for producing a polyphenol resin having a weight-average molecular weight of 3,000 or more as determined by GPC, comprising reacting to condense a polyphenol compound represented by formula (1')

$$(1')$$

wherein, n' is an average degree of polymerization as specified by the average molecular weight, and having a weight-average molecular weight of 1,500 or less as determined by GPC with a biphenyl compound represented by formula (2):

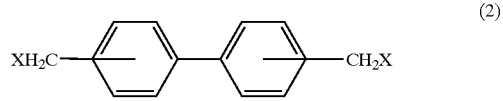

wherein, X is a halogen, a C1–3 alkoxy group or hydroxyl group, in an amount of 0.01 mol or more and less than 0.5 mol relative to 1 equivalent of the phenolic hydroxyl group of the polyphenol compound.

(3.) An epoxy resin composition comprising (a) an epoxy resin having at least two epoxy groups in the molecule and (b) the polyphenol resin according to (1) mentioned above.

(4) The epoxy resin composition according to the above term (3) mentioned above, wherein the epoxy resin is represented by formula (a):

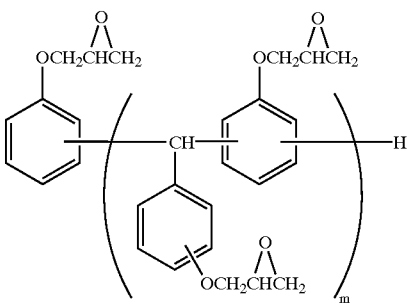

(a)

wherein, m is an average degree of polymerization and a positive number.

(5) The epoxy resin composition according to the above term (3) or (4) further comprising a curing accelerator.
(6) A varnish comprising the polyphenol resin according to the above term (1) and a solvent.
(7) The varnish comprising the epoxy resin composition according to any one of the above terms (3)–(5) containing a solvent.
(8) A sheet comprising a layer formed by drying the varnish according to the above term (6) or (7) on the surface of a flat supporting substrate.
(9) The sheet according to the above term (8), wherein the flat supporting substrate is a polyimide film.
(10) The sheet according to the above term (8), wherein the flat supporting substrate is a metallic foil.
(11) The sheet according to the above term (8), wherein the flat supporting substrate is a release film.
(12) A cured product obtained by curing the epoxy resin composition according to any one of the above terms (3)–(5).
(13) A curing agent for an epoxy resin comprising the polyphenol resin according to the above term (1).

BEST MODE FOR CARRYING OUT THE INVENTION

The present invention will be described in details below.

In the below description, "part(s)" and "%" are "part(s) by mass" and "% by mass" respectively, unless otherwise stated.

In the present invention, a halogen includes chlorine, bromine and iodine; and a C1–3 alkoxy group includes methoxy group, ethoxy group, n-propoxy group and i-propoxy group. In the formula (2), the substituent XCH$_2$— on each phenyl group substitutes at any position of the positions 2, 3, and 4 or the positions 2', 3' and 4'. In the formula (1), the bridging group (—CH$_2$—) corresponding to this substituent is also same as mentioned above.

The polyphenol resin of the present invention having a structure represented by the formula (1) and having a weight-average molecular weight of 3,000 or more as determined by GPC can be obtained for example by reacting to condense a polyphenol compound represented by the above formula (1') with a biphenyl compound represented by the formula (2) in the absence or presence of a solvent generally in amount of 0.01 mol or more and less than 0.5 mol, preferably 0.01–0.45 mol, and more preferably 0.05–0.4 mol relative to 1 equivalent of phenolic hydroxyl group of the polyphenol compound.

In the condensation reaction, an acid catalyst may be used if necessary. An acid catalyst, if the X is a halogen in the biphenyl compound of the formula (2), is not necessary, but if the X is an alkoxy group or hydroxyl group, it is necessary.

The polyphenol resin of the present invention may be obtained by synthesizing a polyphenol compound represented by the formula (1') by a method as described later (the first condensation reaction) and then without isolation of the polyphenol compound reacting to condense the polyphenol compound with a biphenyl compound of the formula (2) (the second condensation reaction).

The biphenyl compound of the formula (2) includes 2,2'-, 3,3'- or 4,4'-bismethoxymethyl biphenyl, 2,2'-, 3,3'- or 4,4'-bisethoxymethyl biphenyl, 2,2'-, 3,3'- or 4,4'-bispropoxymethyl biphenyl, 2,2'-, 3,3'- or 4,4'-bischloromethyl biphenyl, 2,2'-, 3,3'- or 4,4'-bisbromomethyl biphenyl, and 2,2'-, 3,3'- or 4,4'-bihydroxymethyl biphenyl.

The preferable compound of the formula (2) includes a compound where X is a halogen, preferably chlorine or an alkoxy group, preferably methoxy group. For a compound of the formula (2), a mixture of 2,2'product, 3,3'product, 4,4' product and the others is available on the market. A mixture containing 4,4'product as the main component is preferable.

The preferable biphenyl compound represented by the formula (2) to use in the condensation reaction of the present invention includes a compound where X is a halogen, preferably chlorine.

The biphenyl compound of the above formula (2) in the condensation reaction of the present invention is used generally in an amount of 0.01 mol or more and less than 0.5 mol, preferably 0.01–0.45 mol, and more preferably 0.05–0.4 mol relative to 1 equivalent of phenolic hydroxyl group of the compound of the formula (1').

The condensation reaction of the present invention can be carried out in the absence or presence of a solvent, but it is preferable to use the solvent in the reaction because the viscosity of the reaction solution increases with increasing the molecular weight. Any solvent may be used if it has no bad influence on the reaction. The preferable solvent includes a lower alkylene glycol mono- or di-lower alkyl ether. The preferable carbon number in the lower alkylene and the lower alkyl is 1–5. The preferable solvent includes propylene glycol monomethyl ether, propylene glycol monobutyl ether, propylene glycol dimethyl ether, methyl cellosolve and ethyl cellosolve. The amount of the solvent to use is generally 5–500%, preferably 10–400% relative to the mass of a reaction product.

If the compound where X is an alkoxy group, preferably methoxy group is used as a biphenyl compound represented by the formula (2), it is preferable to use an acid catalyst such as hydrochloric acid, sulfuric acid and para-toluene sulfonic acid in the condensation reaction of the present invention. Of these acid catalysts, para-toluene sulfonic acid is the most preferable.

The reaction is made until a biphenyl compound represented by the formula (2) disappears completely. The reaction temperature is generally 60–140° C. The reaction time is generally 1–20 hours.

A polyphenol compound represented by the formula (1') can be obtained by reacting to condense a biphenyl compound represented by the formula (2) with a phenol at such a rate that amount of the phenol is generally 1.5–10 mol, preferably 2–8 mol relative to 1 mol of the biphenyl compound and then removing an unreacted phenol.

In the synthesis of a polyphenol compound of the formula (1') (the above first condensation reaction), an acid catalyst is used if necessary. The acid catalyst, if X is a halogen atom in the biphenyl compound of the formula (2), is not necessary, but if X is an alkoxy group or hydroxyl group, the acid catalyst is used. The preferable biphenyl compound of the formula (2) used in this reaction includes a compound where X is an alkoxy group, preferably methoxy group. The acid catalyst in the first condensation reaction includes hydrochloric acid, sulfuric acid and para-toluene sulfonic acid. Para-toluene sulfonic acid is especially preferable. An amount of the acid catalyst is 0.001–0.1 parts, preferably 0.005–0.05 parts relative to 1 mol of a compound represented by the formula (2). The first condensation reaction can be carried out in the absence or presence of a solvent. When the solvent is used, any solvent may be used if it has no bad influence on the reaction. The preferable solvent includes a lower alcohol such as methanol, ethanol and isopropanol and a lower alkyl lower alkyl ketone such as methyl ethyl ketone and methyl isobutyl ketone. The solvent is used generally in an amount of 10–300%, preferably 20–250% relative to the total mass of a compound represented by the formula (2) and the phenol. The reaction is made until the compound represented by the formula (2) disappears completely. The reaction temperature is generally 40–150° C. The reaction time is generally 1–10 hours. After the condensation reaction terminates, the acid catalyst is removed by neutralizing and washing, and then the solvent and the unreacted phenol are removed by heating under reduced pressure. The condensate thus obtained is represented by the formula (1'), and has a structure that a biphenyl molecule is bonded with a phenol molecule through the methylene bond. The weight-average molecular weight thereof is about 500–1,500. The softening point is about 50–100° C., though it cannot be specified because it varies according to the average molecular weight.

If a compound where X is a halogen in the formula (2) is used in the condensation reaction of the present invention or in the first condensation reaction, it is preferable that the hydrogen halogenide generated as the side reaction product is removed from the reaction system. The method is not limited to a particular one, as long as it can remove the hydrogen halogenide from the system. For example, nitrogen gas is blown into through the one side of a reaction vessel while the hydrogen chloride gas generated as the side reaction product is removed through another side by a tube and then bubbled to trap into an aqueous alkaline solution such as an aqueous sodium hydrogen solution.

The condensation reaction of the present invention is preferably carried out in the presence of a solvent. Sometimes, a couple of thousands ppm of hydrogen chloride which cannot be removed even by the above removing method remain in the solvent. The remaining hydrogen chloride is undesirable when the polyphenol resin solution as obtained above is directly used for a varnish of the present invention as described later. In such a case, the hydrogen chloride is removed as follows. After the reaction terminates, the solution is cooled down to 100° C. or less. Water is added to the solution followed by stirring to make a suspension in order to transfer the hydrogen chloride into water and heating to distill the hydrogen chloride-containing water and the solvent simultaneously by an azeotropic dehydration process. The distilled solvent is then returned back to the system. The hydrogen chloride dissolved in the solvent can be almost removed by repeating the above method.

The condensation reaction of the present invention, if the X is hydroxyl group or an alkoxy group, needs an acid catalyst. The acid catalyst may be same kind and amount as in the first condensation reaction. Water and the alcohol generated as the reaction by-product are removed from the system by a fractionating column.

After the reaction terminates, the by-product or the solvent used can be removed to get a solid polyphenol resin. The polyphenol resin of the present invention has a high molecular weight. Therefore, no or a part of solvent may be removed from the resin so that the resin have a suitable viscosity and have good workability according to an using object.

The polyphenol resin represented by the formula (1) thus obtained has generally an average degree of polymerization (n) of 4 or more, preferably 4–20, and more preferably 4.5–15. The average degree of polymerization is a value calculated from the number-average molecular weight as determined by GPC. The weight-average molecular weight (GPC) is 3,000 or more and preferably 3,000–20,000. The softening point is generally 110–150° C. and, in the preferable embodiment, about 115–145° C. The hydroxyl equivalent is 210–300 g/eq, preferably 215–290 g/eq.

The polyphenol resin composition of the present invention thus obtained can be used suitably as a curing agent for an epoxy resin and a membrane-forming component of a varnish.

The epoxy resin composition of the present invention is characterized by comprising a polyphenol resin composition of the present invention and an epoxy resin having two or more epoxy groups in the molecule, and can be obtained generally by mixing homogeneously the above both and the other ingredients to add if necessary.

The epoxy resin is not limited to a particular one, as long as it has two or more epoxy groups in the molecule. It concretely includes a novolac type epoxy resin or a triphenylmethane type epoxy resin, a dicyclopentadiene phenol condensation type epoxy resin, a xylylene structure-containing phenol novolac type epoxy resin, a biphenyl structure-containing novolac type epoxy resin, a bisphenol A type epoxy resin, a bisphenol F type epoxy resin and a tetramethyl biphenol type epoxy resin, though not limited to these epoxy resins. These epoxy resins may be used alone or in combination of the two or more.

In these epoxy resins, it is preferable that a resin represented by the following formula (a)

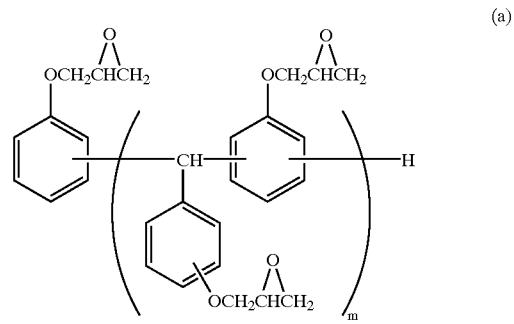

wherein m is an average value and is generally a positive number of 1.0–5, preferably 1.1–4, is used because it can provide a cured product having excellent heat resistance.

As a curing agent in the epoxy resin composition of the present invention, other curing agents may be used in combination with a polyphenol resin of the present invention. Any other curing agent may be used as long as it can be used as an curing agent for an epoxy resin. The other curing agents include diamino diphenyl methane, diethylene triamine, triethylene tetramine, diamino diphenyl sulfone, isophorone diamine, dicyan diamide, a polyamide resin synthesized from linolenic acid dimer and ethylene diamine, phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, methylhexahydrophthalic anhydride, phenol novolac, triphenylmethane and these denatured products, imidazole, $BF_3$-amine complex, and a guanidine derivative, though not limited to these substances. A polyphenol resin of the present invention, if used in combination with these other curing agents, is contained generally in rate of 0.2 equivalent weight or more, preferably 0.3 equivalent rate or more in all the curing agents.

The curing agent in an epoxy resin composition of the present invention is used preferably in an amount of 0.7–1.2 equivalent relative to 1 equivalent of epoxy group of the epoxy resin.

A curing accelerator may be used in combination with the above curing agent in an epoxy resin composition of the present invention. The curing accelerator includes, for example, an imidazole such as 2-methylimidazole, 2-ethylimidazole, and 2-ethyl-4-methylimidazole; a tertiary amine such as 2-(dimethylaminomethyl)phenol,and1,8-diaza-bicyclo(5,4,0) undecene-7; a phosphine such as triphenylphosphine; and a metal compound such as stannum octylate. The curing accelerator is used if necessary in an amount of 0.1–5.0 parts relative to 100 parts of an epoxy resin and may have been mixed as one component in the epoxy resin composition of the present invention or may be mixed when the epoxy resin is used.

An epoxy resin composition of the present invention may contain an inorganic filler if necessary. The inorganic filler includes, for example, silica, alumina and talc. The inorganic filler to use has a share of 0–90% in the epoxy resin composition of the present invention.

An epoxy resin composition of the present invention may contain various ingredients including a silane coupling agent, a releasing agent such as stearic acid, palmitic acid, zinc stearate and calcium stearate and a pigment if necessary.

An epoxy resin composition of the present invention can be obtained by mixing homogeneously the above components in their respective rates and can be used in various fields as a conventional epoxy resin composition has been used. A polyphenol resin of the present invention, which has a structure of the biphenyl group bonded with phenol through methylene group, has a high refractive index. The epoxy resin composition of the present invention, which contains the polyphenol resin, has also a high refractive index and hence can be suitably used as an optical material for optical lens, lens for spectacles, a substrate for optical disc and plastic optical fiber. In this case, a biphenyl structure-containing novolac type epoxy resin (for example, NC-3000S or NC-3000S-H made by NIPPON KAYAKY), which has same structure as a polyphenol resin of the present invention does, is used as the epoxy resin component, resulting in an excellent effect.

An epoxy resin composition of the present invention may contain a solvent in some cases. The epoxy resin composition containing the solvent can be infiltrated into a base material such as glass fiber, carbon fiber, polyester fiber, polyamide fiber, alumina fiber and paper, followed by heating to dry to get a prepreg. The prepreg can then be pressed and molded under heating to obtain the cured product of an epoxy resin composition of the present invention. The content of solvent in the epoxy resin composition is generally 10–70%, preferably 15–70% relative to the total amount of the epoxy resin composition of the present invention and the solvent. The epoxy resin composition containing the solvent can be used as a varnish as described below. The solvent includes toluene, xylene, acetone, methyl ethyl ketone and methyl isobutyl ketone, as will be shown in the below paragraph of varnish.

As long as a varnish of the present invention comprises a polyphenol resin of the present invention and a solvent, the other components are not limited. Provided that the varnish of the present invention is a liquid composition in which the polyphenol resin, the solvent and if necessary additional optional components are mixed homogeneously, a method for producing the liquid composition is not limited to any particular one. For example, the reaction solution as obtained in the process for producing the polyphenol resin of the present invention, which contains the polyphenol resin and the solvent, can be used directly as a varnish of the present invention. One or more selected from the group consisting of the other optional component, the polyphenol resin and a solvent, if necessary, can be added to the reaction solution to get a varnish of the present invention. Alternatively, the reaction solution may be concentrated to make a concentrate, to which the other optional component and/or the polyphenol resin are added if necessary to get a varnish of the present invention. An isolated polyphenol resin may be mixed homogeneously with the other optional component if necessary in a solvent to get a varnish of the present invention.

The optional component added into a varnish of the present invention is not limited to any particular one as long as it does not block the membrane formation or the adhesive property of a polyphenol resin of the present invention. The preferable one, however, includes a polymer, an epoxy compound and their accompanying additive that are able to form a membrane together with the polyphenol resin. The polymer is preferably soluble in a solvent used in a varnish of the present invention. One of the preferable varnishes includes a varnish containing the epoxy compound. The varnish containing both an epoxy resin composition of the present invention and a polyphenol resin of the present invention is specifically preferable.

A solvent used in a varnish of the present invention includes γ-butyrolactones, an amide solvent such as N-methyl pyrrolidone(NMP), N,N-dimethyl formamide (DMF), N,N-dimethyl acetamide and N,N-dimethyl imidazolidinone; a solfone such as tetramethylene sulfone; an ether solvent such as diethylene glycol dimethyl ether, diethylene glycol diethyl ether, propylene glycol, propylene glycolmonomethyl ether, propylene glycol monomethyl ether monoacetate, propylene glycol monobutyl ether, preferably a lower alkylene glycol mono or di-lower alkyl ether; a ketone solvent such as methyl ethyl ketone and methyl isobutyl ketone, preferably a di-lower alkyl ketone where the two alkyl groups may be same or not; and an aromatic solvent such as toluene and xylene. The preferable solvent includes a lower alkylene glycol mono or di-lower alkyl ether and the above di-lower alkyl ketone. These solvents may be used alone or in combination of the two or more.

The solid part in the varnish thus obtained is generally a concentration of 10–90%, preferably 20–80%, more preferably 25–70%. The remainder is the solvent.

The content of the polyphenol resin of the present invention in the varnish is generally content of 10–60%, preferably 20–50% relative to the total amount of the varnish. The content of the epoxy resin is content of 10–40%, preferably 15–35%. The other additive is content of 0–20%.

A sheet of the present invention can be obtained by coating the above varnish on a base material, preferably on the surface of a flat supporting substrate by a known coating method such as gravure coating, screen process printing, metal masking and spin coating followed by drying. The sheet thus obtained has a thickness (a thickness after drying) of 5–300 μm, preferably 5–200 μm, more preferably 10–160 μm. The varnish may be coated on the one side surface, the both side surfaces or the partial surface of a flat supporting substrate if necessary. The coating method to use is suitably chosen according to the kind, shape, scale of a base material and the thickness of a membrane. The base material includes a film made of polymer and/or copolymer such as polyamide, polyamidimide, polyarylate, polyethylene terephthalate, polybutylene terephthalate, poly(ether ether ketone), poly(etherimide), poly(ether ketone), polyketone, polyethylene and polypropylene; and a metal foil such as a copper foil. A film made of polyimide or a metal foil is preferable.

The sheet having a membrane formed with the varnish of the present invention thus obtained is useful as a substrate for electric/electronic parts.

A sheet shape of adhesive agent can be produced by coating the varnish of the present invention on a release film and then heating to remove the solvent and to bring the resin into the B stage. The sheet shape of adhesive agent thus obtained can be used for the interlayer dielectric layer in a multiplayer board.

EXAMPLE

The present invention is described below in details by examples and comparative examples. In the examples, the measurement conditions of GPC are as follows:

Apparatus: Shodex SYSTEM-21
Column: KF-804L+KF-803L (×2 columns) connected
Eluate: THF(tetrahydrofurane); 1 ml/min., 40° C.
Detector: RI(RI-71S), UV(254 nm, UV-41)
Sample: about 0.4% THF solution (100 μl inject)
Calibration curve: Shodex standard polystyrene used Example 1

121 parts of the compound (bismethoxymethyl biphenyl) represented by the following formula (3):

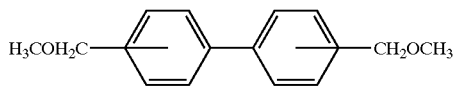

(3)

and 188 parts of phenol were put in a flask equipped with a thermometer, a cooler, a fractionating column and a stirrer in the presence of purging nitrogen gas and were dissolved by raising the temperature up to 130° C. under stirring. 0.5 parts of para-toluene sulfonic acid was added, followed by reacting for 3 hours under the removal of the arising methanol from the system through the fractionating column. After the reaction terminated, 260 parts of methyl isobutyl ketone was added. The mixture was washed thrice with water. The oil layer was distilled by heating under reduced pressure using evaporator to remove methyl isobutyl ketone and the unreacted phenol, and 170 parts of the compound (n'=2.2, average) (called Compound A) represented by the formula (1') was obtained. Compound A thus obtained had a softening point of 68° C., a melt viscosity of 0.08 Pa·s at 150° C., a hydroxyl equivalent of 204 g/eq, and a weight-average molecular weight of 940 as determined by GPC.

204 parts of Compound A, 50.1 parts of the compound (bischlormethyl biphenyl) represented by the following formula (4):

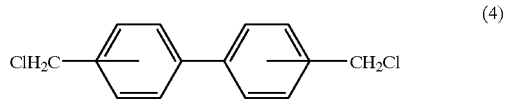

(4)

and 24.0 parts of propylene glycol monobutyl ether were put in a flask equipped with a thermometer, a fractionating column, a stirrer and a cooler to the top end of which a silicone tube was connected so that inside-arising hydrochloric acid gas is able to expel from the system under purging nitrogen gas. Another open end of the silicone tube was fixed to another vessel containing an aqueous sodium hydroxide solution to immerse in. The solution was heated up to 150° C. under stirring to carry out the dehydrochlorination reaction. Generated hydrochloric acid gas was trapped in the aqueous sodium hydroxide solution. The reaction was carried out for 6 hours followed by cooling the reaction system down to 140° C., adding further 72.0 parts of another propylene glycol monobutyl ether and then cooling furthermore down to 80° C. 120 parts of 80° C. hot water was added to make a suspension, which was stirred for 30 minutes and heated to distill water and propylene glycol monobutyl ether away from the system with an azeotropic dehydration. Only the propylene glycol monobutyl ether was returned back in the system by the fractionating column. The procedure, starting with adding hot water and ending with returning only propylene glycol monobutyl ether back in the system by the fractionating column, was repeated thrice. The solution was cooled to 70° C., and 144 parts of methyl ethyl ketone was added to obtain 480 parts of a 50% varnish of the polyphenol resin of the present invention. The polyphenol resin thus obtained had a weight-average molecular weight of 12,800 as determined by GPC, a hydroxyl equivalent of 248 g/eq and n in the formula (1) was 7(averaged).

Example 2

27 parts of the compound NC-3000P as an epoxy resin (made by NIPPON KAYAKU KK, epoxy equivalent 270 g/eq, softening point 58° C., n=2.5 (averaged)) represented by the formula (5):

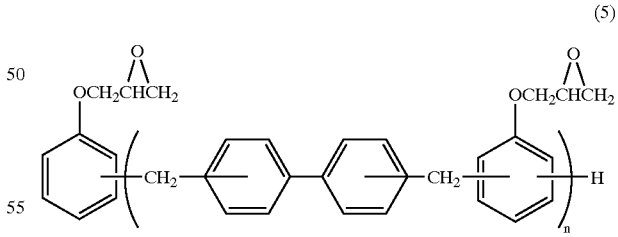

(5)

73.8 parts of 50 wt % propylene glycol monomethyl ether/methyl ethyl ketone solution (propylene glycol monomethyl ether: methyl ethyl ketone=96:144) of the polyphenol resin obtained in Example 1 as a curing agent, and 0.27 parts of triphenyl phosphine as a curing accelerator were mixed and stirred for 3 hours at 100° C. to make a solution. The solution was cooled down to room temperature to get a varnish of the present invention. The varnish was coated on a polyimide film by an applicator so that a membrane after drying could have a thickness of 25 μm. The test piece obtained was heated for 3 hours at 150° C. to get a cured product. The cured product obtained on the polyimide had satisfactory film-forming performance, because it was free from cracking while the polyimide was rounded to bend. The cured product was tested in respect to noninflammability according to UL94-VTM. It was confirmed to clear VTM-0.

Example 3

The epoxy resin (EPPN-502H, made by NIPPON KAYAKU KK, epoxy equivalent:170 g/eq, softening point:70.2° C., m=1.9 in the formula (1)) represented by the above formula (a), the 50% solution of polyphenol resin obtained in Example 1 as a curing agent, and triphenyl phosphine as a curing accelerator were mixed at a mass ratio as shown in Table 1 and dissolved homogeneously to make a varnish. The solution was cooled down to room temperature to get a varnish of the present invention.

TABLE 1

| Composition of mixture | Example 1 |
| --- | --- |
| EPPN-502H | 100 |
| 50% solution of polyphenol resin | 291 |
| triphenyl phosphine | 1 |

The varnish thus obtained was coated on a polyimide film by an applicator so that a membrane after drying could have a thickness of 25 μm. The test piece obtained was heated for 3 hours at 180° C. to get a cured product. The cured product thus obtained on the polyimide film had satisfactory film-forming performance, because it was free from cracking while the polyimide film was rounded to bend. The cured product was tested in respect to noninflammability according to UL94-VTM. It was confirmed to clear VTM-0.

The varnish was coated on a 30 μm thick copper foil by an applicator so that a membrane could have a thickness of 150 μm after drying. The test piece thus obtained was heated for 3 hours at 180° C. followed by dissolving the copper foil in an etching solution to get a cured product. The cured product had a glass transition point of 208° C. as determined by DMA (Dynamic viscoelasticity measurement apparatus).

INDUSTRIAL APPLICABILITY

A polyphenol resin of the present invention, if used as a curing agent for an epoxy resin, can provide a cured product which has high flexibility, can be molded to a thin membrane and has excellent noninflammability, compared with a conventionally used epoxy resin composition. An epoxy resin composition of the present invention is very useful for the wide application to molding material, casting material, laminating material, paint, adhesive and resist.

What is claimed is:

1. A method for producing a polyphenol resin having a weight-average molecular weight of 3,000 or more as determined by GPC, comprising reacting to condense a polyphenol compound represented by formula (1')

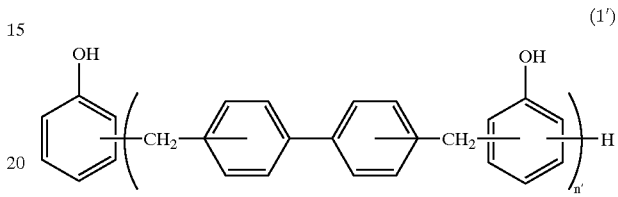

(1')

wherein, n' is an average degree of polymerization as specified by the average molecular weight, and having a weight-average molecular weight of 1,500 or less as determined by GPC with a biphenyl compound represented by formula (2)

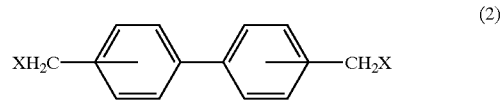

(2)

wherein, X is a halogen, a C1–3 alkoxy group or hydroxyl group, in an amount of 0.01 mol or more and less than 0.5 mol relative to 1 equivalent of the phenolic hydroxyl group of said polyphenol compound.

* * * * *